(12) United States Patent
Sznajder et al.

(10) Patent No.: US 8,543,368 B1
(45) Date of Patent: Sep. 24, 2013

(54) METHOD AND SYSTEM FOR TESTING

(75) Inventors: Henri Sznajder, Kiryat Bialik (IL); Muhannad Ghanem, Haifa (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 420 days.

(21) Appl. No.: 12/536,126

(22) Filed: Aug. 5, 2009

Related U.S. Application Data

(60) Provisional application No. 61/086,378, filed on Aug. 5, 2008.

(51) Int. Cl.
*G06F 17/50* (2006.01)
(52) U.S. Cl.
USPC .......................................... 703/14

(58) Field of Classification Search
USPC ...................... 703/13, 14; 716/106, 111, 136
See application file for complete search history.

(56) References Cited

U.S. PATENT DOCUMENTS

| | | | | |
|---|---|---|---|---|
| 6,080,203 | A * | 6/2000 | Njinda et al. | 716/136 |
| 7,530,036 | B2 * | 5/2009 | Nahir et al. | 716/106 |
| 2002/0183990 | A1 * | 12/2002 | Wasynczuk et al. | 703/2 |

* cited by examiner

*Primary Examiner* — Kamini S Shah
*Assistant Examiner* — Andre Pierre Louis

(57) ABSTRACT

Aspects of the disclosure provide methods and systems for improving test generation using constraint solving problem (CSP) techniques. A test method can include modeling a circuit as logic constraints to correlate outputs of the circuit as logic functions of inputs of the circuit, pre-determining at least a value constraint that specifies a desired output value for an output of the circuit, and solving input values for the inputs to satisfy the logic constraints for the circuit and the value constraint of the output.

19 Claims, 5 Drawing Sheets

```
1:  create_param ('in', '0-9');
2:  create_param ('out', '0-1');
3:  keep ((in>3)==>(out==1):(out==);# if (in>3) then (out==1) else (out==0)
4:  out=0;
```

METHOD AND SYSTEM FOR TESTING

INCORPORATION BY REFERENCE

This application claims the benefit of U.S. Provisional Application No. 61/086,378, "Generating End to End Self Checking Test Scenarios Using CSP Modeling Techniques" filed on Aug. 5, 2008, which is incorporated herein by reference in its entirety.

BACKGROUND

Testing techniques are used in integrated circuit (IC) design and IC manufacturing. In an IC design example, a design can be tested to verify logic and timing correctness. In an IC manufacturing example, an IC chip can be tested to detect defects and can be tested to validate its functionality.

SUMMARY

Aspects of the disclosure can provide methods and systems for improving test generation using constraint solving problem (CSP) techniques. The test generation methods can use the CSP techniques to generate a set of input values for a circuit based on correlations between inputs and outputs of the circuit to satisfy pre-determined output values of the circuit. According to the disclosure, the CSP based test generation methods can be used to automatically generate test scenarios for end to end (inputs to outputs) testing. The generated scenarios can be directed random that a portion of the parameters can be random parameters.

To generate a test scenario, a method can include modeling a circuit as logic constraints to correlate outputs of the circuit as logic functions of inputs of the circuit, pre-determining at least a value constraint that specifies a desired output value for an output of the circuit in the test scenario, and solving input values for the inputs to satisfy the logic constraints for the circuit and the value constraint of the output.

To solve the input values for the inputs to satisfy the logic constraints for the circuit and the value constraint of the output, the method can include starting a constraint solving problem (CSP) engine to solve the input values. Further, the method can include implementing the logic constraints and the value constraint in the CSP engine. In addition, the method can include solving output values for the outputs.

The generated test scenario can be used to test circuit implementations, such as integrated circuit (IC) designs, IC devices, and the like. To test a circuit design, the method can include computing output values of a circuit design in response to the input values of the circuit design, and comparing the computed output values with the solved output values to verify the circuit design.

To test an IC device, the method can include applying electrical signals to the IC device based on the input values, measuring output signals of the IC device, and comparing the output signals with the solved output values to validate the IC device.

According to an embodiment of the disclosure, the method can include storing the solved input values and the corresponding solved output values. Further, the stored inputs values and output values can be used to test circuit designs and IC devices.

Aspects of the disclosure can provide a system for verifying a circuit design. The system can include a directed random constraint solving problem (CSP) engine configured to solve input values to inputs of the circuit design based on logic constraints that correlate outputs of the circuit design as logic functions of the inputs, and at least one value constraint that specifies a pre-determined value of an output for a scenario, a simulator unit configured to apply the solved input values to the circuit design, and compute simulation outputs of the circuit design.

In addition, the directed random CSP engine can be configured to solve output values based on the logic constraints and the value constraint. The system can also include a comparator unit configured to compare the simulation outputs and solved output values. In addition, the system can include a memory unit configured to store the solved input values with the solved output values for the scenario, provide the solved input values to the simulator to simulate the circuit design and provide the solved output values to the comparator for comparison.

According to an embodiment, the directed random CSP engine can include a CSP engine having a processor executing instructions to determine legal values for variables to satisfy constraints of the variables. The CSP engine can randomize the input values and the output values until all constraints are solved.

Aspects of the disclosure can provide a system for validating an integrated circuit (IC) device. The system can include a directed random constraint solving problem (CSP) engine configured to solve input values to inputs of the IC device based on logic constraints that correlate outputs of the IC device as logic functions of the inputs, and at least one value constraint that specifies a pre-determined value of an output for a scenario, and a tester unit configured to apply electrical signals to the IC device according to the solved input values, and measures outputs of the IC device.

In the context of network switching devices, aspects of the disclosure can provide a method for testing a switch device. The method can include modeling switching circuitry as logic constraints to correlate egress ports of the switch device as logic functions of packets input to the switch device, pre-determining an egress port that constrains a desired egress port from which the input packets are output from the switch device, and determining at least one set of parameter values for inputting packets to satisfy the logic constrains and the egress port constraint.

To determine the set of parameter values for inputting packets to satisfy the logic constrains and the egress port constraint, the method can include starting a constraint solving problem (CSP) engine to solve the set of parameter values to satisfy the logic constrains and the egress port constraint. Further, the method can include implementing the logic constraints and the egress port constraint in the CSP engine.

To determine the set of parameter values for inputting packets to satisfy the logic constrains and the egress port constraint, the method can include determining at least one of a media access control (MAC) address and an ingress port.

The method can be used to test a circuit design or a switch device. To test a circuit design, the method can include applying the determined set of parameter values to at least an input packet, computing an egress port according to the circuit design in response to the input packet, and comparing the egress port with the pre-determined egress port to verify the circuit design. To test a switch device, the method can include inputting at least an input packet having the determined set of parameter values to the switch device, and detecting an egress port from which the input packet is output. Then, the method can include comparing the egress port with the pre-determined egress port.

Aspects of the disclosure can provide a system for verifying a design of a switch device. The system can include a directed random constraint solving problem (CSP) engine configured to generate at least a set of parameter values for inputting packets to the switch device based on logic constraints that correlate egress ports of the switch device as logic functions of the input packets, and a pre-determined egress port that constraints a desired egress port for the input packets. Further, the system can include a simulator unit configured to simulate inputting at least an input packet having the generated set of parameter values to the design of the switch device, and compute an egress port for the input packet based on the design.

Aspects of the disclosure can provide a system for validating a switch device. The system can include a directed random constraint solving problem (CSP) engine configured to generate at least a set of parameter values for inputting packets to the switch device based on logic constraints that correlate egress ports of the switch device as logic functions of the input packets, and a pre-determined egress port that constraints a desired egress port for the input packets. Further, the system can include a tester unit configured to input at least one packet having the generated set of parameter values to the switch device and detect an egress port of the switch device from which the packet is output.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
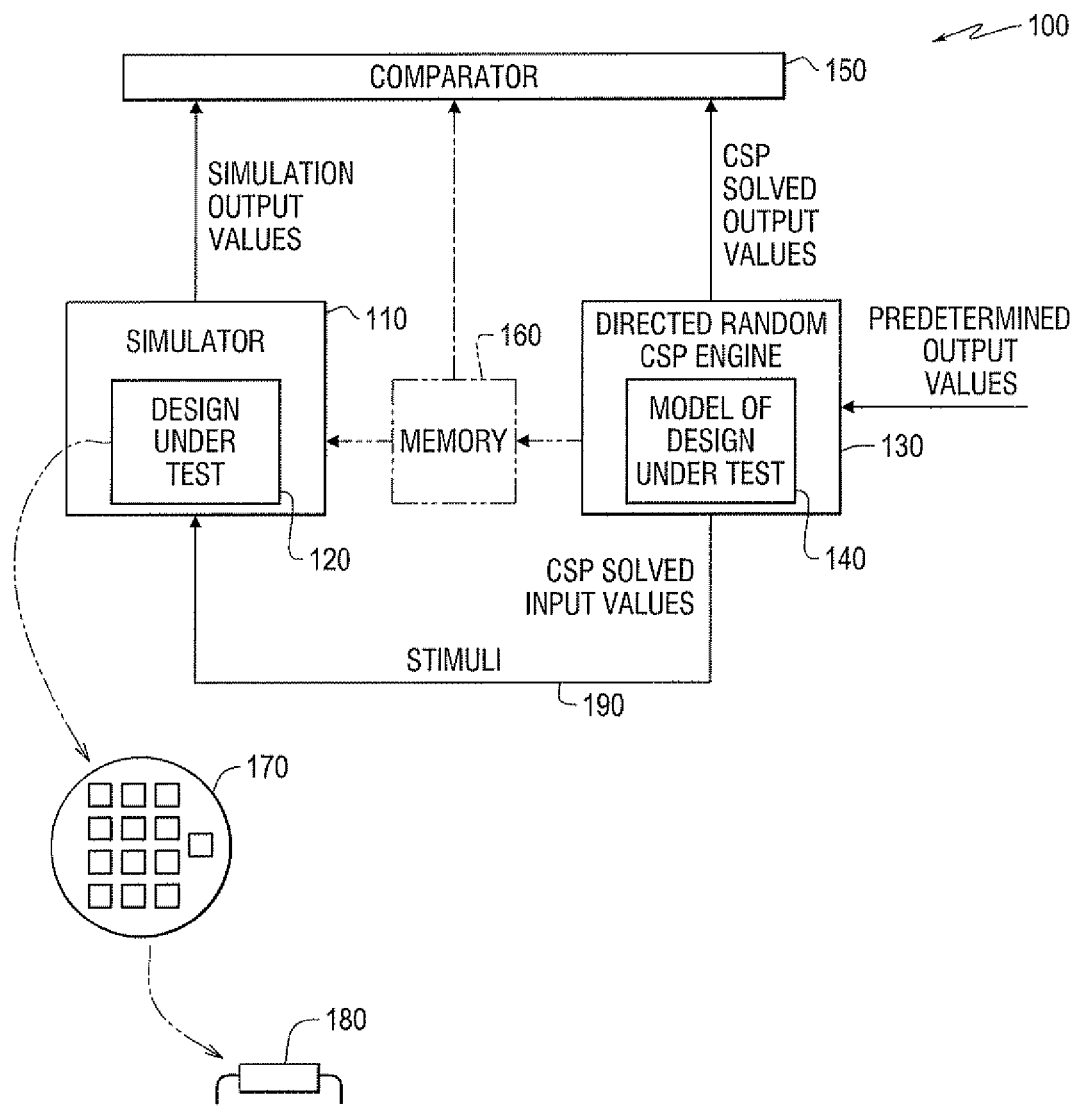
FIG. 1 shows a block diagram of a pre-silicon design verification system example according to an embodiment of the disclosure.

FIG. 1 shows a block diagram of a pre-silicon design verification system example according to an embodiment of the disclosure. The pre-silicon design verification system 100 can include a simulator unit 110, a directed random constraint solving problem (CSP) engine 130, and a comparator unit 150. These elements can be coupled together as shown in FIG. 1.

The simulator unit 110 can include suitable components to simulate a circuit design. In other words, the simulator unit 110 can compute values of outputs in response to values of inputs based on the circuit design. In an example, the simulator unit 110 may include a design-under-test module 120. The design-under-test module 120 may specify the outputs of the circuit design as functions of the inputs. Further, the simulator unit 110 may receive values for the inputs, and generate output values based on the received input values and the functions specified in the design-under-test module 120.

In an embodiment, the simulator unit 110 may receive the values for the inputs from the directed random CSP engine 130, as shown by the stimuli 190 in FIG. 1. In another embodiment, the simulator unit 110 may receive the values for the inputs from a memory unit 160, which can be coupled to the directed random CSP engine 130 and store the values of the inputs that can be generated by the directed random CSP engine 130.

The design-under-test module 120 can include any suitable pre-silicon design, such as a register-transfer-level (RTL) design, a synthesized gate-level design, a transistor-level design, and the like. Further, the design-under-test module 120 can include circuit designs of any suitable sizes, such as in block-size, in chip-size, and the like. The design-under-test module 120 can be modularized into a plurality of portions, and each portion can be individually designed. For example, a first portion of the design-under-test module 120 can be in the gate-level design, and a second portion of the design-under-test module 120 can be in the RTL design.

In an embodiment, the design-under-test module 120 can be a whole-chip design. The whole-chip design can be finalized into a final tape-out. According to the final tape-out of the whole-chip design, integrated circuit (IC) chips 170 can be manufactured. Further, the IC chips 170 can be assembled into IC packages 180.

The directed random CSP engine 130 can generate values of inputs (stimuli) for a circuit design, such as the design-under-test module 120, using CSP techniques. The values of inputs can be generated to verify whether the circuit design can produce the pre-determined values of outputs in response to the values of the inputs. The directed random CSP engine 130 can include a CSP engine, which can be any suitable CSP engine that can determine legal values of variables based on constraints of the variables. In an example, the CSP engine can randomize the input values and the output values until all constraints are solved. The CSP engine can be implemented as software instructions being executed by a processor.

Further, the directed random CSP engine 130 can include a model 140 of the circuit design. The model 140 can include inputs and outputs of the circuit design as variables, and can specify correlations between the inputs and the outputs as correlation constraints of the variables. In addition, the directed random CSP engine 130 may receive the pre-determined output values, for example, as desired output values of the circuit design in a scenario. The pre-determined output values can also be implemented in the model 140 as value constraints. Then, the CSP engine can be started to generate legal values of the variables to satisfy the various constraints, which include the correlation constraints and the value constraints. The legal values of the variables can include values of the inputs that can satisfy the correlation constraints, which define the logic functions of the circuit design, and the value constraints, which define the pre-determined output values. The legal values can also include solved values of the outputs, which may include the ones that have been pre-determined.

It is noted that directed random CSP engine 130 may receive pre-determined values for intermediate variables, and may solve the values for the inputs and the values of the outputs.

The values of the inputs can be provided to the simulator unit 110 to generate simulation output values of the design-under-test 120 for the scenario. In addition, the directed random CSP engine 130 can provide the solved output values to the comparator 150 to compare the solved output values with the simulation output values of the design-under-test 120 for the scenario.

The model 140 can be any suitable model to specify the correlations between the inputs and outputs of the circuit design. In an embodiment, the model 140 can specify the correlations as logic functions in a high level software language. The high level software language can be compatible with the software of the CSP engine, or can be the same software language as the CSP engine in the directed random CSP engine 130.

It is also noted that the variables in the model 140 can be any suitable types, such as binary variables, high level parameters, and the like. In a network switching device example, the model 140 may specify logic functions of the network switching device in high level parameters to simplify the model 140 and further simply the constraint solving problem. For example, the model 140 may use the high level parameters, such as port numbers, media access control (MAC) addresses, and the like. Thus, the network switching device can be modeled as determining a port number for outputting a packet as a function of a MAC address in the packet.

Further, the directed random CSP engine 130 may receive a port number as a desired port for outputting packets in a scenario, for example, to test the logic function of the network switching device to direct packets to a specific egress port. Accordingly, the directed random CSP engine 130 can generate MAC addresses. The MAC addresses can be generated randomly or pseudo randomly. Packets having the generated MAC addresses can be expected to be output from the desired port in the scenario according to the logic function of the network switching device.

Generally, packets received by a network switching device can be processed in accordance with a logic of the network switching device, e.g. directed to egress ports in accordance with the logic. The packets having the generated MAC addresses can be used to evaluate whether the design-under-test module 130 has correctly implemented the logic.

Normally, a CSP engine can be used to solve legal inputs to a design that satisfy input constraints. The directed random CSP engine 130 can determine the legal inputs in the sense to generate random inputs that can satisfy output constraints (desired output values). In the network switching device example, the directed random CSP engine 130 may randomly or pseudo randomly generate MAC addresses that can result in packets having the generated MAC address being output to the desired port according to the logic of the model 140.

In an embodiment, the directed random CSP engine 130 may generate one MAC address for evaluating the design-under-test module 130 for a scenario, such as directing packets to a specific egress port. In another example, the directed random CSP engine 130 may generate multiple MAC addresses for evaluating the design-under-test module 130 for a scenario.

The comparator unit 150 can compare the solved output values for the scenario and the simulation output values of the design-under-test 120 to verify the correctness of the design-under-test 120. When the simulation output values are the same as the solved output values, the correctness of the design-under-test 120 for the scenario is verified. When the simulation output values are not the same as the solved output values, the pre-silicon design verification system 100 can detect incorrectness of the design-under-test 120 for the scenario.

It is noted that the pre-silicon design verification system 100 may include suitable interfaces (not shown) between components to suitably transport data between the components. For example, when the design-under-test module 120 in the simulator unit 110 uses binary inputs, an interface (not shown) between the simulator unit 110 and the directed random CSP engine 130 can suitably convert the stimuli generated by the directed random CSP engine 130, which can be in the form of high level parameters, into binary values for inputting to the simulator unit 110.

It is also noted that pre-silicon design verification system 100 may include the memory unit 160 to suitably store the generated values for inputs. In an example, the memory unit 160 can be coupled to the directed random CSP engine 130 to store the generated values for the inputs. Additionally, the memory unit 160 may store the solved output values with the generated values for the inputs. Then, the memory unit 160 may provide the values for the inputs to the simulator unit 120 as stimuli to compute simulation output values. Further, the memory unit 160 can provide the solved output values to the comparator unit 150 for comparison with the simulation output values.

It is also noted that the pre-silicon design verification system 100 can be implemented as one or more processors executing software modules. For example, pre-silicon design verification system 100 may include various software modules, such as a simulator module, a directed random CSP engine module, a comparator module, and the like. Further, the pre-silicon design verification system 100 may include one or more suitable processors that can execute the various software modules.

According to other aspects of the disclosure, the pre-silicon design verification system 100 may include specific hardware implemented components. For example, the simulator module 110 may be a field programmable gate array (FPGA) simulator that can be configured to simulate operations of a FPGA that has been programmed according to a circuit design.

Figure 2:
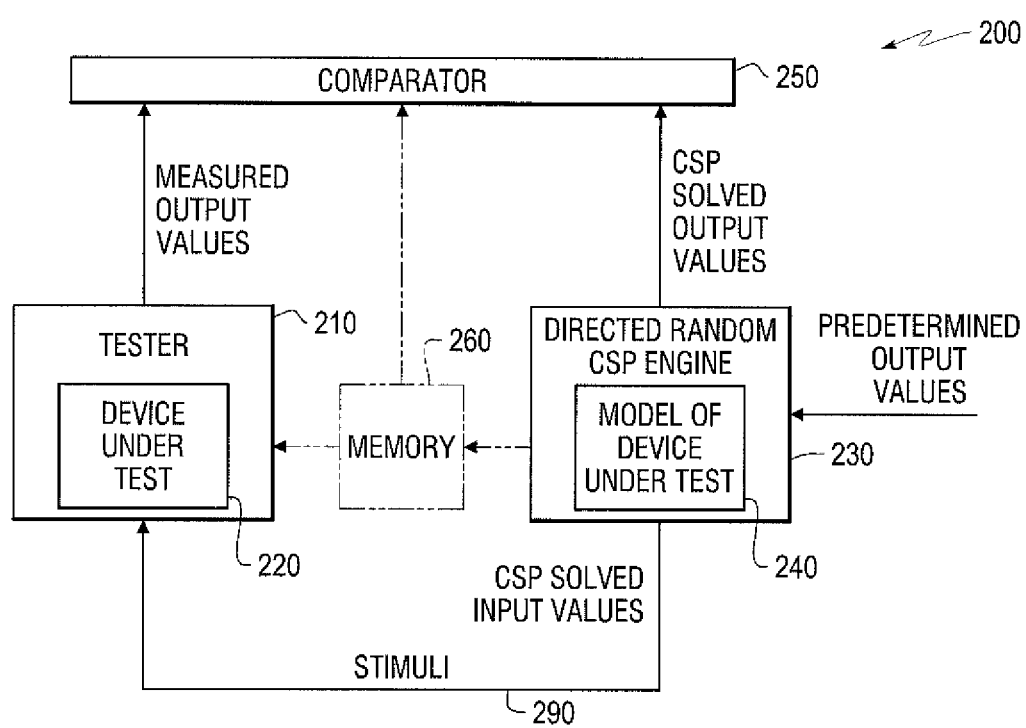
FIG. 2 shows a block diagram of a post-silicon chip validation system example according to an embodiment of the disclosure.

FIG. 2 shows a block diagram of a post-silicon validation system example according to an embodiment of the disclosure. The post-silicon validation system 200 can validate functionalities of a device-under-test, such as an IC chip, an IC package, and the like. The post-silicon validation system 200 can include a tester unit 210, a directed random constraint solving problem (CSP) engine 230, and a comparator unit 240. These elements can be coupled together as shown in FIG. 2.

The tester unit 210 can include suitable components to test a device-under-test 220. The device-under-test 220 can be any suitable silicon implementations, such as an IC chip, an IC package, and the like. In an IC chip example, the tester unit 210 may include a probe component to electrically couple power supplies and various measuring devices to input and output pads of an IC chip. In an IC package example, the tester unit 210 may include a handler component to electrically couple power supplies and various measuring devices to input and output pins of an IC package. Additionally, the tester unit 210 may include suitable power supplies, and various measuring devices.

The tester unit 210 can receive input values, suitably supply input signals to the device-under-test 220 according to the received input values, and measure values of outputs in response to the supplied input signals.

In an embodiment, the tester unit 210 may receive the values for the inputs from the directed random CSP engine 230, as shown by the stimuli in FIG. 2. In another embodiment, the tester unit 210 may receive the values for the inputs from a memory module 260, which can be coupled to the directed random CSP engine 230 and store the values of the inputs that can be generated by the directed random CSP engine 230.

The directed random CSP engine 230 can generate values of inputs (stimuli) for testing the device-under-test 220 using CSP techniques. The values of inputs can be used to validate the functionality of the device-under-test 220. The directed random CSP engine 230 can include a CSP engine, which can be any suitable CSP engines that can determine legal values of variables based on constraints of the variables. In an example, the CSP engine can randomize the input values and the output values until all constraints are solved. In an embodiment, the CSP engine can be implemented as software instructions being executed by a processor.

Further, the directed random CSP engine 230 can include a model 240 of the device-under-test 220. The model 240 can include inputs and outputs of the device-under-test 220 as variables, and can specify correlations between the inputs and the outputs as correlation constraints of the variables. In addition, the directed random CSP engine 230 may receive the pre-determined output values, for example, as desired output values of the device-under-test 220 in a scenario. The pre-determined output values can also be implemented in the model 240 as value constraints. Then, the CSP engine can be started to generate legal values of the variables to satisfy the various constraints, which include the correlation constraints and the value constraints. The legal values of the variables can include values of the inputs that can satisfy the correlation constraints, and the value constraints. The legal values can also include solved values of the outputs, which may include the ones that have been pre-determined.

It is noted that directed random CSP engine 230 may received pre-determined values for intermediate variables, and may solve the values for the inputs and the values of the outputs based on the pre-determined values for the intermediate variables.

The values of the inputs can be provided to the tester unit 210. The tester unit 210 can supply input signals to the device-under-test 220 according to the received values of the inputs and measure output signals of the device-under-test 220. In addition, the directed random CSP engine 230 can provide the solved output values to the comparator 250 to compare the solved output values with the measure output signals.

The model 240 can be any suitable models to specify the correlations between the inputs and outputs of the device-under-test 220. In an embodiment, the model 240 can specify the correlations as logic functions in a high level software language. The high level software language can be compatible with the software of the CSP engine, or can be the same software language as the CSP engine in the directed random CSP engine 230.

It is also noted that the variables in the model 240 can be any suitable types, such as binary variables, high level parameters, and the like. In a network switching device example, the model 240 may specify logic functions of the network switching device in high level parameters to simplify the model 240 and further simply the constraint solving problem. For example, the model 240 may use the high level parameters, such as port numbers, MAC addresses, and the like. Thus, the network switching device can be modeled as determining a port number for outputting a packet as a function of an MAC address in the packet.

Further, the directed random CSP engine 230 may receive a port number as a desired port for outputting packets in a scenario, for example, to test the logic function of the network switching device to direct packets to a specific egress port. Accordingly, the directed random CSP engine 230 can generate MAC addresses. The MAC addresses can be generated randomly or pseudo randomly. Packets having the generated MAC addresses can be expected to be output from the desired port in the scenario based on the logic function of the network switching device.

Generally, packets received by a network switching device can be processed in accordance with a logic of the network switching device, e.g. directed to egress ports in accordance with the logic. The packets having the generated MAC addresses can be used to evaluate whether the device-under-test module 230 has correctly implemented the logic.

Normally, a CSP engine can be used to solve legal inputs to a design that satisfy input constraints. The directed random CSP engine 230 can determine the legal inputs in the sense to generate random inputs that can satisfy output constraints (desired output values). In the network switching device example, the directed random CSP engine 230 may randomly or pseudo randomly generate MAC addresses that can result in packets having the generated MAC address being output to the desired port according to the logic of the model 240.

In an embodiment, the directed random CSP engine 230 may generate one MAC address for evaluating the device-under-test module 230 for a scenario, such as directing packets to a specific egress port. In another example, the directed random CSP engine 230 may generate multiple MAC addresses for evaluating the device-under-test module 230 for the scenario. In another example, the directed random CSP engine 230 may generate incorrect MAC addresses with correct MAC addresses for the scenario. When packets with the incorrect MAC addresses are output by the specific egress port, the device-under-test module 230 can be considered as defective.

The comparator unit 250 can compare the solved output values for the scenario and the measured output values of the device-under-test 220 to validate the function of the device-under-test 220. When the measured output values are the same as the solved output values, the function of the device-under-test 220 for the scenario is validated. When the measured output values are not the same as the solved output values, the post-silicon device validation system 200 can detect failure of the device-under-test 220 for the scenario.

It is noted that the post-silicon device validation system 200 may include suitable interfaces (not shown) between components to suitably transport data between the components. For example, when the model 240 uses high level parameters for modeling the device-under-test 220, an interface (not shown) between the tester unit 210 and the directed random CSP engine 230 can suitably convert the input values generated by the directed random CSP engine 230, which can be in the form of high level parameters, into binary values for inputting to the tester unit 210.

It is also noted that post-silicon design validation system 200 may include the memory unit 260 to suitably store the generated values for inputs. In an example, the memory unit 260 can be coupled to the directed random CSP engine 230 to store the generated values for the inputs. Additionally, the memory unit 260 may store the pre-determined output values with the generated values for the inputs. Then, the memory unit 260 may provide the values for the inputs to the tester unit 210 as stimuli to measure output values of the device-under-test 220 in response to the stimuli. Further, the memory unit 260 can provide the pre-determined output values to the comparator unit 250 for comparison with the measured output values.

It is also noted that the directed random CSP engine 130 in FIG. 1 and the directed random CSP engine 230 in FIG. 2 can be a same engine, or can be different engines. In addition, the stimuli 190 generated by the directed random CSP engine 130 and the stimuli 290 generated by the directed random CSP engine 230 can be the same or can be different.

In an embodiment, the device-under-test 220 can be a silicon implementation of the design-under-test 120. The stimuli 190 generated by the directed random CSP engine 130 can be stored and used as the stimuli 290 to validate the device-under-test 220.

In another embodiment, the directed random CSP engine 130 and the directed random CSP engine 230 can be configured differently to generate different stimuli to suit for different test aspects in the design and the manufacturing. For example, in the design, the directed random CSP engine 130 may be configured to generate a minimum set of stimuli 190 to verify the correctness of the design-under-test 120. In the manufacturing, the directed random CSP engine 230 may be configured to generate a large number of stimuli 290 to validate the functionality of the device-under-test 220 in a stress test.

Figure 3:
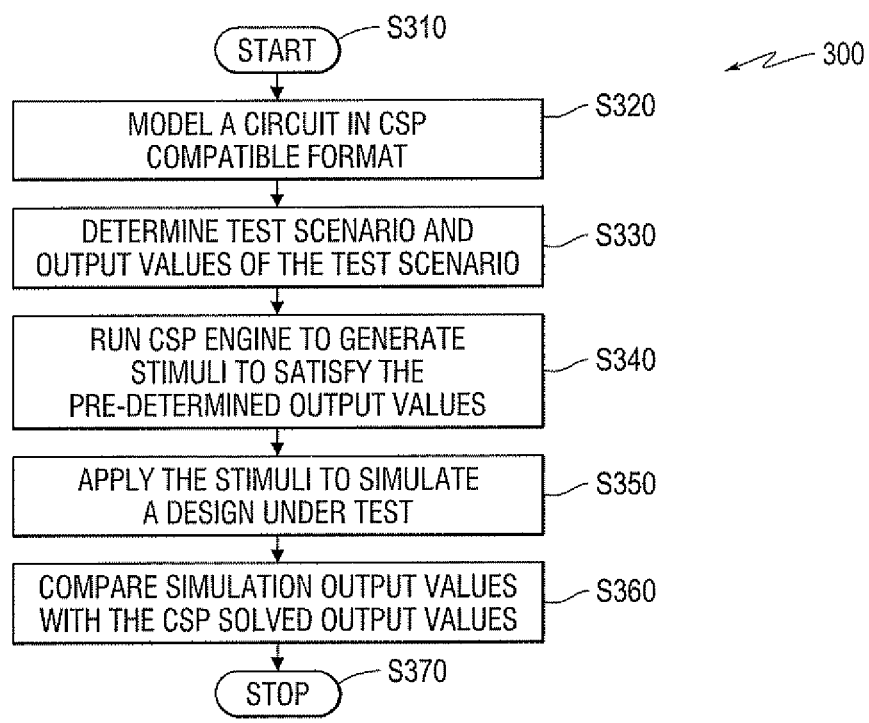
FIG. 3 shows a flow chart outlining a process example for pre-silicon design verification according to an embodiment of the disclosure.

FIG. 3 shows a flow chart outlining a process example for pre-silicon design verification according to an embodiment of the disclosure. The pre-silicon design verification process 300 can verify correctness of a design-under-test, which can be any suitable circuit designs, such as RTL design, gate-level design, transistor-level design, modularized design, full-chip design, and the like. The process starts at step S310, and proceeds to step S320.

In step S320, a circuit model can be generated in the form that is compatible with a CSP engine. The CSP engine can be a software module being executed by a processor. The CSP engine can determine legal values of variables to satisfy constraints of the variables. In an example, the circuit model can be written using a high level software language that is compatible with the software module of the CSP engine. The high level software language may specify inputs and outputs of the circuit model as variables, specify functions of the circuit model in the form of correlations (correlation constraints) between the inputs and the outputs. In an embodiment, the inputs and the outputs can be high level parameters, and the correlation constraints can be high level logic functions to reduce the circuit model complexity. Then, the process proceeds to step S330.

In step S330, one or more test scenarios can be determined. Further, the output values for the test scenarios, for example, desired output values for the test scenarios, can be determined. In a network switch example, a test scenario that packets are switched based on aMAC address in the packets may be determined. Further, the desired output values for the test scenario, for example, a specific port number for outputting packets, can be determined. The test scenarios and the desired output values can also be specified in the form of constraints. For example, the test scenarios can be specified in configuration constraints, and the desired output values can be specified as output constraints. The configuration constraints and the output constraints can be suitably associated with the CSP engine. Then, the process proceeds to step S340.

In step S340, the CSP engine can start to solve input values (stimuli) that can satisfy the pre-determined output values based on the circuit model. More specifically, the CSP engine can solve legal values for variables that satisfy the correlation constraints, the configuration constraints and the output constraints. The level values for variables can include solved stimuli for the inputs and solved output values for the outputs under the scenario. In the network switch example, the CSP engine can generate, for example, one or more MAC addresses, for the test scenario. The MAC addresses can be used as input values (stimuli) to test, for example, whether packets with the MAC addresses being switched to the specific port under the test scenario. Then, the process proceeds to step S350.

In step S350, the generated input values can be provided to simulate a design-under-test for verifying the correctness of the design-under-test for the test scenario. In an embodiment, the CSP engine and a simulator for simulating the design-under-test can be suitable coupled, for example, by an interface. The interface can suitably convert the generated input values from the CSP engine to input values for the design-under-test, such as converting values for high level parameters used in the circuit model to binary input values for simulating the design-under-test. Further, the simulator can compute simulation output values of the design-under-test in response to the input values. Then, the process proceeds to step S360.

In step S360, the simulation output values and the solved output values can be compared to determine the correctness of the design-under-test for the test scenario. When the simulation output values and the solved output values are the same, the design-under-test can be determined to be correct for the test scenario; when the simulation output values and the pre-determined output values are not the same, the design-under-test can be determined to be in-correct for the test scenario. It is noted that the simulation output values and/or the solved output values may need to be suitably converted for comparison. Then, the process proceeds to step S370 and terminates.

Figure 4:
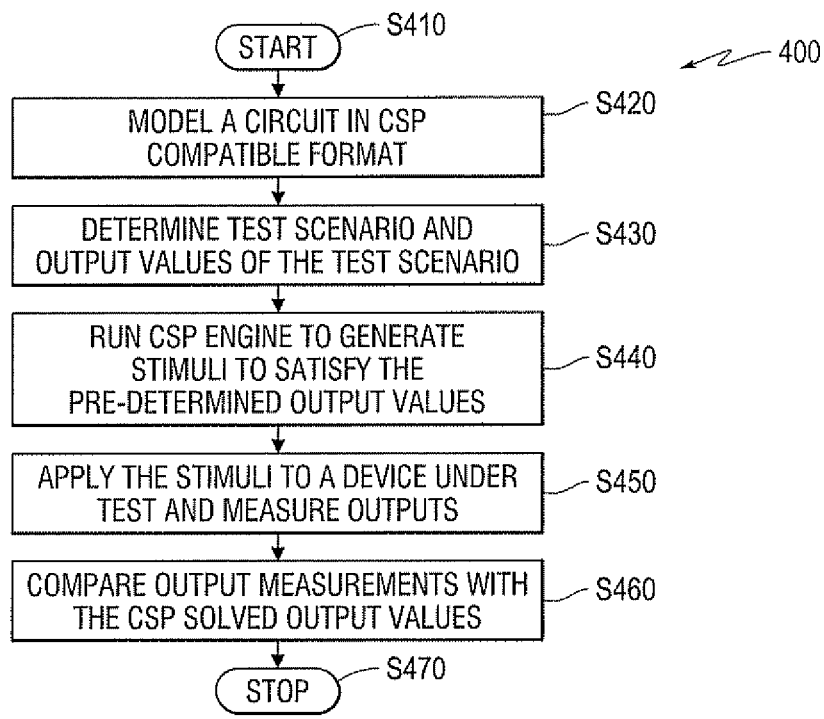
FIG. 4 shows a flow chart outlining a process example for post-silicon chip validation according to an embodiment of the disclosure.

FIG. 4 shows a flow chart outlining a process example for post-silicon device validation according to an embodiment of the disclosure. The post-silicon device validation process 400 can validate the functionality of a device-under-test, which can be any suitable silicon implementation, such as an IC chip, an IC package, and the like. The process starts at step S410, and proceeds to step S420.

In step S420, a circuit model for the silicon implementation can be generated in the form that is compatible with a CSP engine. The CSP engine can be a software module being executed by a processor. The CSP engine can determine legal values of variables to satisfy constraints of the variables. In an example, the circuit model can be written using a high level software language that is compatible with the software module of the CSP engine. The high level software language may specify inputs and outputs of the circuit model as variables, specify functions of the circuit model in the form of correlations (correlation constraints) between the inputs and the outputs. In an embodiment, the inputs and the outputs can be high level parameters, and the correlation constraints can be high level logic functions to reduce the circuit model complexity. It is noted that the circuit model can be the same as the circuit model used in the step S320 in FIG. 3, to reduce workload. Then, the process proceeds to step S430.

In step S430, one or more test scenarios can be determined. Further, the output values for the test scenarios, for example, desired output values for the test scenarios, can be determined. In a network switch example, a test scenario that packets are switched based on aMAC address in the packets may be determined. Further, the desired output values for the test scenario, for example, a specific port number for outputting packets, can be determined. The test scenarios and the desired output values can also be specified in the form of constraints. For example, the test scenarios can be specified in configuration constraints, and the desired output values can be specified as output constraints. The configuration constraints and the output constraints can be suitably associated with the CSP engine.

It is noted that the test scenarios can be the same as the test scenarios in the pre-silicon verification process, or can be different from the pre-silicon verification process. In an embodiment, the test scenarios determined in this step can include a portion from the test scenarios determined in step S330. Additionally, the test scenario determined in this step may include a portion that is not in the test scenarios in step S330, such as stress test scenarios. Then, the process proceeds to step S440.

In step S440, the CSP engine can start to generate input values (stimuli) that can satisfy the pre-determined output values based on the circuit model. More specifically, the CSP engine can generate legal values for variables that satisfy the correlation constraints, the configuration constraints and the output constraints. The level values for variables can include solved stimuli for the inputs and solved output values for the outputs under the scenario. In the network switch example, the CSP engine can generate, for example, one or more MAC addresses, for the test scenario. The MAC addresses can be used as input values (stimuli) to test, for example, whether packets with the MAC addresses being switched to the specific port under the test scenario.

It is noted that when a test scenario in this step is substantially the same as a test scenario in step S340, the step S440 may be skipped for the test scenario, and the generated input values in the step S340 can be stored, and retrieved in this step. Then, the process proceeds to step S450.

In step S450, the generated input values can be provided to test a device-under-test for validating the functionality of the device-under-test for the test scenario. In an embodiment, the CSP engine and a tester for testing the device-under-test can be suitable coupled, for example, by an interface. The interface can suitably convert the generated input values from the CSP engine to input values for the device-under-test, such as converting values for high level parameters used in the circuit model to binary input values for testing the design-under-test. Further, the tester can provide suitable electrical signals to the device-under-test according to the input values, and measure outputs in response to the provided electrical signals. Then, the process proceeds to step S460.

In step S460, the output measurements and the solved output values can be compared to validate the functionality of the device-under-test for the test scenario. When the output measurements and the solved output values are the same, the functionality of the device-under-test can be confirmed for the test scenario; when the output measurements and the solved output values are not the same, the device-under-test can be determined mal-function for the test scenario. It is noted that the output measurements and/or the solved output values may need to be suitably converted for comparison. Then, the process proceeds to step S470 and terminates.

Figures 5, 6:
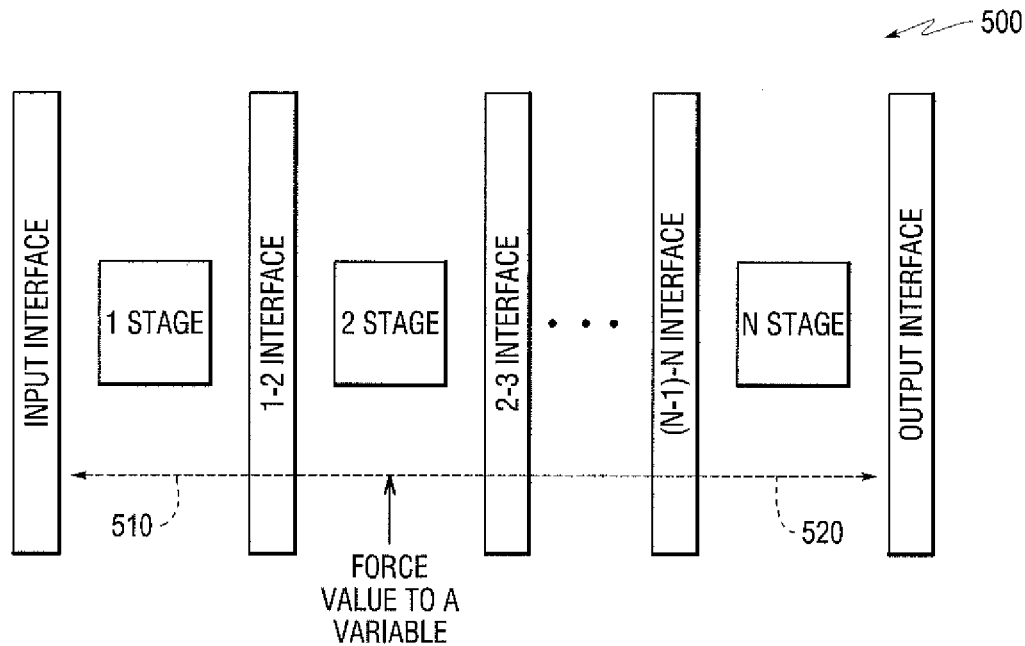
FIG. 5 shows a block diagram of a circuit design example according to an embodiment of the disclosure.
FIG. 6 shows an example of constraint codes according to an embodiment of disclosure.

FIG. 5 shows a block diagram of a circuit model example according to an embodiment of the disclosure. The circuit model 500 may include multiple units coupled in a pipeline manner. More specifically, the circuit model 500 may include an input interface, a first stage, a first-second interface, a second stage, a second-third interface, so on so forth, and an output interface. Each of the stages can receive stage inputs from an interface coupled to a previous stage, and provide stage outputs to an interface coupled to a next stage.

The circuit model can specify the stage inputs and stage outputs as variables, and specify the logic functions between the stage inputs and the stage outputs in the form of correlation constraints. In addition, the circuit model may specify values for one or more variables, in the farm of value constraints. The variables of specified values can be anywhere in the pipeline, such as in a final stage of the circuit model, in an intermediate stage, and the like.

According to an embodiment of the disclosure, the circuit model 500, which includes correlation constraints and the value constraints, can be solved by a CSP engine. The CSP engine can determine input values to the circuit model to satisfy all the constraints, as shown by 510. In addition, the CSP engine may solve output values of the circuit model in response to the input values, as shown by 520.

In an embodiment, the input values and the output values can be suitable stored. Further, the input values and the output values can be used to verify a design-under-test in IC design, and can be used to validate a silicon implementation in IC manufacturing.

FIG. 6 shows a simple example of constraint codes for a CSP engine according to an embodiment of disclosure. The constraint codes 600 may include an input variable 'in', which can be created and constrained by code 1, and an output variable 'out', which can be created and constrained by code 2. Further, the constraint codes 600 may include correlation constraints, such as code 3, to specify the logic functions between the variable 'in' and the variable 'out'. In addition, the constraint codes 600 may include value constraints, such as code 4, to specify a value for the variable 'out'.

According to an embodiment of the disclosure, a CSP engine can generate at least a value for the variable 'in' that can satisfy all the constraints in the constraint codes 600.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A method for testing a switch device, comprising:
receiving, by a processor, logic constraints for modeling switching circuitry of the switch device, the logic constraints being configured to correlate egress ports of the switch device as logic functions of packets input to the switch device;
receiving, by the processor, a predetermined egress port that constrains a desired egress port from which the input packets are output from the switch device; and
determining, by the processor, at least one set of parameter values including at least ingress port identifications for inputting packets to satisfy the logic constraints and the egress port constraint, wherein the determining includes using a constraint solving problem (CSP) engine to solve a circuit model having an input interface, a first stage, a first-second interface, a second stage, a second-third interface, and an output interface, each of the stages being configured to receive stage inputs from an interface coupled to a previous stage, and provide stage outputs to an interface coupled to a next stage.

2. The method of claim 1, wherein determining, by the processor, the set of parameter values for inputting packets to satisfy the logic constraints and the egress port constraint, further comprises:
starting a constraint solving problem (CSP) engine to solve the set of parameter values to satisfy the logic constraints and the egress port constraint.

3. The method of claim 2, further comprising:
implementing the logic constraints and the egress port constraint in the CSP engine.

4. The method of claim 1, wherein determining, by the processor, the set of parameter values for inputting packets to satisfy the logic constraints and the egress port constraint, further comprises:
determining at least one of a media access control (MAC) address and an ingress port.

5. The method of claim 1, further comprising:
applying the determined set of parameter values to at least an input packet.

6. The method of claim 5, wherein applying the determined set of parameter values to the input packet, further comprises:
computing an egress port in a circuit design of the switch device in response to the input packet; and
comparing the egress port with the pre-determined egress port to verify the circuit design.

7. The method of claim 5, wherein applying the determined set of parameter values to the input packet, further comprises:
inputting the input packet having the determined set of parameter values to the switch device; and
detecting an egress port from which the input packet is output.

8. The method of claim 7, further comprising:
comparing the egress port with the pre-determined egress port.

9. The method of claim 1, further comprising:
storing the determined set of parameter values and the pre-determined egress port.

10. A system for verifying a design of a switch device, comprising:
a plurality of processors executing a module of a directed random constraint solving problem (CSP) engine to generate at least a set of parameter values including at least ingress port identifications for inputting packets to the switch device based on logic constraints that correlate egress ports of the switch device as logic functions of the input packets, and a pre-determined egress port that constrains a desired egress port for the input packets, wherein the CSP engine includes solving a circuit model having an input interface, a first stage, a first-second interface, a second stage, a second-third interface, and an output interface, each of the stages being configured to receive stage inputs from an interface coupled to a previous stage, and provide stage outputs to an interface coupled to a next stage; and
the plurality of processors executing a module of a simulator to simulate inputting at least an input packet having the generated set of parameter values to the design of the switch device, and compute an egress port for the input packet based on the design.

11. The system of claim 10, wherein the plurality of processors executing the module of the directed random CSP engine is further configured to generate at least one of a media access control (MAC) addresses and an ingress port number.

12. The system of claim 11, further comprising:
a comparator unit configured to compare the computed egress port with the desired egress port.

13. The system of claim 12, further comprising:
a memory unit configured to store the generated set of parameter values and the desired egress port.

14. The system of claim 10, wherein
the plurality of processors executes instructions to determine legal values for variables to satisfy constraints of the variables.

15. A system for validating a switch device, comprising:
a plurality of processors executing a module of a directed random constraint solving problem (CSP) engine to generate at least a set of parameter values including at least ingress port identifications for inputting packets to the switch device based on logic constraints that correlate egress ports of the switch device as logic functions of the input packets, and a pre-determined egress port that constrains a desired egress port for the input packets, wherein the CSP engine includes solving a circuit model having an input interface, a first stage, a first-second interface, a second stage, a second-third interface, and an output interface, each of the stages being configured to receive stage inputs from an interface coupled to a previous stage, and provide stage outputs to an interface coupled to a next stage; and
a tester unit configured to input at least one packet having the generated set of parameter values to the switch device and detect an egress port of the switch device from which the packet is output.

16. The system of claim 15, wherein the plurality of processors executing the module of the directed random CSP engine is configured to generate at least one of a media access control (MAC) address and an ingress port number.

17. The system of claim 16, further comprising:
a comparator unit configured to compare the detected egress port and the desired egress port.

18. The system of claim 17, further comprising:
a memory unit configured to store the generated set of parameter values and the desired egress port.

19. The system of claim 15, wherein
the plurality of processors executes instructions to determine legal values for variables to satisfy constraints of the variables.

* * * * *